US007820555B2

(12) United States Patent
Doris et al.

(10) Patent No.: US 7,820,555 B2
(45) Date of Patent: Oct. 26, 2010

(54) METHOD OF PATTERNING MULTILAYER METAL GATE STRUCTURES FOR CMOS DEVICES

(75) Inventors: Bruce B. Doris, Brewster, NY (US); Richard S. Wise, Newburgh, NY (US); Hongwen Yan, Somers, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 569 days.

(21) Appl. No.: 11/870,577

(22) Filed: Oct. 11, 2007

(65) Prior Publication Data
US 2009/0098737 A1    Apr. 16, 2009

(51) Int. Cl.
*H01L 21/302* (2006.01)
*H01L 21/461* (2006.01)
(52) U.S. Cl. .................................. 438/722; 438/706
(58) Field of Classification Search .................. 438/722, 438/710, 711, 712
See application file for complete search history.

(56) References Cited

U.S. PATENT DOCUMENTS 6,187,656 B1    2/2001    Lu et al.
6,197,702 B1    3/2001    Tanabe et al.
6,277,722 B1    8/2001    Lee et al.
6,579,784 B1    6/2003    Huang
6,869,868 B2 *  3/2005    Chiu et al. .................. 438/592
7,163,880 B2    1/2007    Visokay

OTHER PUBLICATIONS

Deok-Kee Kim et al.; "A study of the role of HBr and oxygen on the etch selectivity and the post-etch profile in a polysilicon/oxide etch using HBr/O2 based high density plasma for advanced DRAMs;" Materials Science in Semiconductor Processing 10 (2007) pp. 41-48.

\* cited by examiner

*Primary Examiner*—Roberts Culbert
(74) *Attorney, Agent, or Firm*—Cantor Colburn LLP; Joseph Petrokaitis

(57) ABSTRACT

A method of forming patterning multilayer metal gate structures for complementary metal oxide semiconductor (CMOS) devices includes performing a first etch process to remove exposed portions of a polysilicon layer included within a gate stack, the polysilicon layer formed on a metal layer also included within the gate stack; oxidizing an exposed top portion of the metal layer following the first etch process so as to create an metal oxide layer having an etch selectivity with respect to the polysilicon layer; removing the metal oxide layer through a combination of a physical ion bombardment thereof, and the introduction of an isotropic chemical component thereto so as to prevent oxide material at bottom corners of the polysilicon layer; and performing a second etch process to remove exposed portions of the metal layer.

20 Claims, 6 Drawing Sheets

METHOD OF PATTERNING MULTILAYER METAL GATE STRUCTURES FOR CMOS DEVICES

BACKGROUND

The present invention relates generally to semiconductor device processing techniques and, more particularly, to a method of patterning multilayer metal gate structures for complementary metal oxide semiconductor (CMOS) devices.

Transistor gate electrodes made of doped polysilicon have long been used in the manufacture of metal oxide semiconductor (MOS) transistors. The use of doped polysilicon gates becomes problematic, however, as the dimensions of gates and gate dielectrics are reduced. In particular, small polysilicon gates can accommodate only a finite amount of dopant material. This limitation can in turn result in a depletion of gate charge carriers at the interface between the gate and gate insulator (dielectric), when the gate electrode of a device is biased to invert the channel. Consequently, the electrical thickness of the gate dielectric is substantially increased, thereby deteriorating the performance characteristics of the transistor, such as reducing the drive current and switching speed. Depletion of the polysilicon gate is thus a fundamental issue that limits further scaling of MOS devices.

Metal gate stacks are an attractive alternative to polysilicon gates since they have a larger supply of charge carriers than doped polysilicon gates. One existing type of metal gate stack structure includes both a lower metal layer and an upper polysilicon layer. When a metal gate stack is inverted, there is no substantial depletion of carriers at the interface between the metal gate layer and the gate dielectric. Accordingly, the transistor's performance is not deteriorated because the electrical thickness of the gate stack is not increased.

On the other hand, the fabrication of such metal gate stack structures presents its own set of unique challenges, such as the problem of metal foot formation at the bottom of the stack, resulting from standard metal gate etch processing. More specifically, for so called "gate first" integration schemes, a thin metal layer (e.g., TiN) is deposited over a gate insulating layer and substrate, followed by a thicker layer of polysilicon. A gate stack structure is then patterned using either a hardmask or softmask approach. Using conventional etch techniques, chemistries such as HBr or Cl are introduced in order to etch both the polysilicon layer and metal layer of the gate stack. Unfortunately, the etch chemistry used in etching the polysilicon layer has poor etch selectivity with respect to the underlying metal layer in the stack. Thus, differences in the chemical reactivity of metal and polysilicon during the polysilicon overetch lead to a degraded gate stack profile (e.g., polysilicon footing, metal footing, metal undercutting, etc.)

As is known in the art, the gate stack structure determines (in part) the source/drain extension implant and diffusion profile. Ideally, the extension profile is highly abrupt, and is achieved only when the gate profile is straight. In the case of metal foot formation, problems in addition to non-ideal source/drain extension and diffusion profiles also arise. For example, with conventional metal gate reactive ion etch (RIE) methods, the footing is not uniform or consistent within a single wafer, or from wafer to wafer for that matter. Such variations lead to uncontrollable extension profiles that in turn cause voltage threshold ($V_t$) variations that are unacceptable from a performance and manufacturing standpoint. In addition, metal footing also adds to outer fringe capacitance, which also degrades circuit performance. Simulations have shown that the presence of a metal foot in a transistor gate can add about 0.03-0.04 fF/µm per side, which in turn results in up to about 8% loss in circuit performance.

Accordingly, it would be desirable to be able to implement an improved method of metal gate stack patterning in a manner that addresses the problems created by degraded stack profiles, including those attributed to metal foot formation following the etching of the metal layer in the gate stack.

SUMMARY

The foregoing discussed drawbacks and deficiencies of the prior art are overcome or alleviated, in an exemplary embodiment, by a method of forming patterning multilayer metal gate structures for complementary metal oxide semiconductor (CMOS) devices using dedicated etch processes for each film to optimize profiles. A first etch process is used to anisotropically remove exposed portions of a polysilicon layer included within a gate stack, the polysilicon layer formed on a metal layer also included within the gate stack. Rather than overetching into the gate metal as in the state of the art, an exemplary embodiment oxidizes an exposed top portion of the metal layer following the first etch process so as to create an metal oxide layer having an etch selectivity with respect to the polysilicon layer. This oxidation is followed by removing the metal oxide layer through a combination of a physical ion bombardment thereof, and the introduction of an isotropic chemical component thereto so as to prevent residual metal oxide barrier layers at the inside corner of the gate; and performing a second etch process to remove exposed portions of the metal layer.

In another embodiment, a method of patterning multilayer metal gate structures for complementary metal oxide semiconductor (CMOS) devices includes forming a gate dielectric layer over a substrate; forming a metal layer over the gate dielectric layer; forming a polysilicon layer over the metal layer so as to define a gate stack; defining a gate stack pattern by patterning one or more of a hardmask material and a photoresist material; transferring the gate stack pattern into exposed portions the polysilicon layer by performing a first etch process; oxidizing an exposed top portion of the metal layer following the first etch process so as to create an metal oxide layer having an etch selectivity with respect to the polysilicon layer; removing the metal oxide layer through a combination of a physical ion bombardment thereof, and the introduction of an isotropic chemical component thereto so as to prevent residual metal oxide barrier layers at the inside corner of the gate; performing a second etch process to remove exposed portions of the metal layer; and removing exposed portions of the gate dielectric layer following the second etch process.

BRIEF DESCRIPTION OF THE DRAWINGS

Referring to the exemplary drawings wherein like elements are numbered alike in the several Figures.

DETAILED DESCRIPTION

Disclosed herein is a method of patterning multilayer metal gate structures for complementary metal oxide semiconductor (CMOS) devices, which results in a straight gate profile. Briefly stated, the embodiments disclosed herein enable etch selectivity of polysilicon to metal by transforming a top portion of the metal layer into another material that has etch selectivity with respect to polysilicon. This in turn enables tuning of the metal etch independent of the polysilicon etch, and additionally increases process control by effectively providing an etch stop layer. In one exemplary embodiment, a top portion of the metal layer is transformed into a metal oxide layer, the etch rate of which is significantly slower than the etch rate of polysilicon. Thereby, the polysilicon etch may be terminated, after which another non-selective etch process is initiated for the remaining metal in the stack (once the oxide layer is punched through), which is sufficiently anisotropic so as to create a straight gate profile.

Figure 1A:
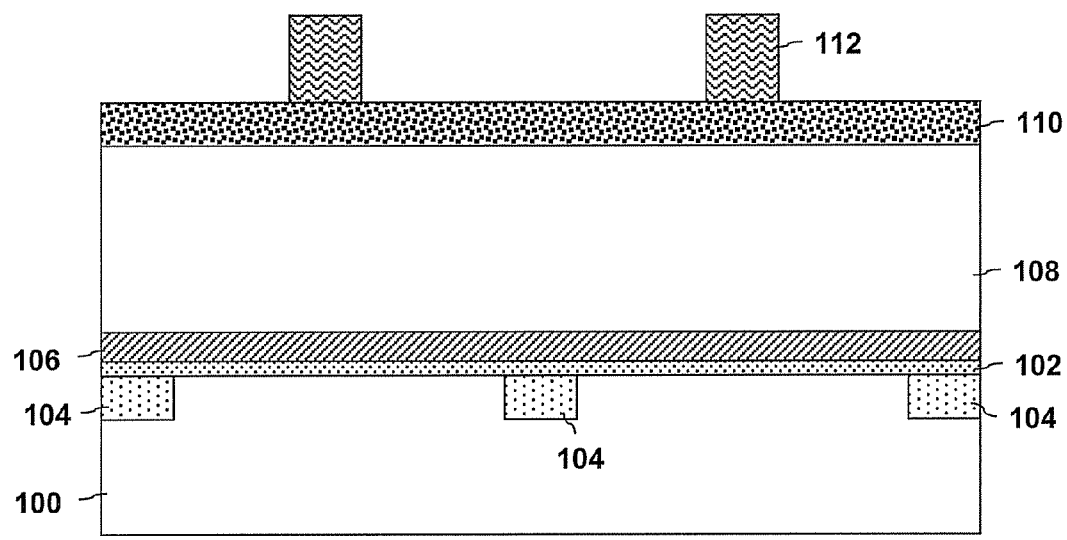
FIGS. 1(a) through 1(h) are a sequence of cross sectional views illustrating a method of patterning multilayer metal gate structures for complementary metal oxide semiconductor (CMOS) devices, in accordance with an embodiment of the invention.

Referring to FIGS. 1(a) through 1(h), there is shown a sequence of cross sectional views illustrating a method of patterning multilayer metal gate structures for complementary metal oxide semiconductor (CMOS) devices, in accordance with an embodiment of the invention. As shown in FIG. 1(a), a semiconductor substrate 100 has a gate dielectric layer 102 (e.g., silicon oxide) formed thereon. The substrate 100 may include a bulk silicon or a silicon-on-insulator (SOI) structure, for example, although other semiconductor materials such as germanium, silicon germanium, silicon germanium-on-insulator, silicon carbide, indium antimonide, indium arsenide, indium phosphide, gallium arsenide, gallium aresenide, etc. are also contemplated.

Although not specifically shown in the figures, the gate stack may also include another high-k dielectric layer formed on gate dielectric layer 102 such as, for example, hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. However, other gate dielectric materials that serve to reduce gate leakage may also be utilized.

Figure 1B:
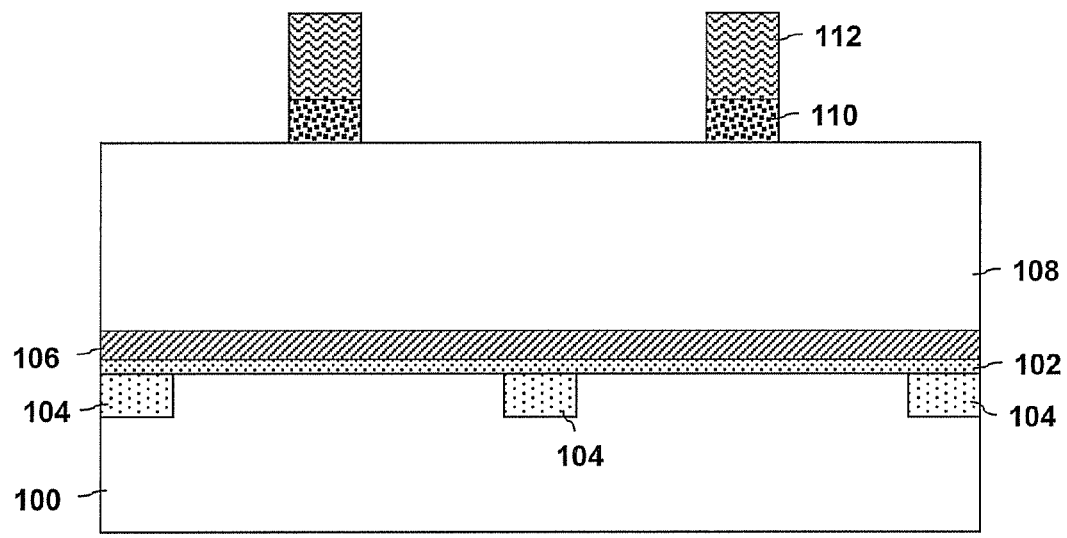
Figure 1C:
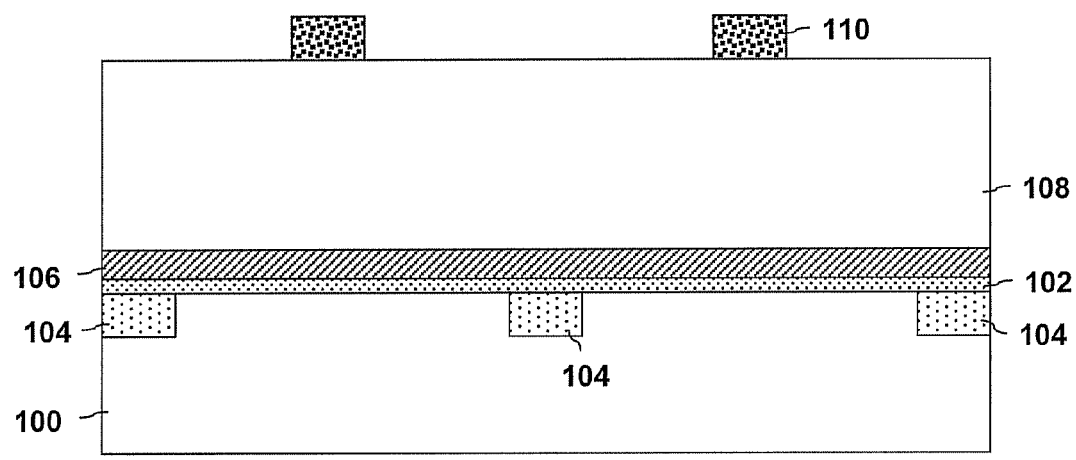

As further illustrated in FIG. 1(a), the substrate 100 has a plurality of shallow trench isolation (STI) regions 104 formed therein, which define complementary CMOS device regions NFET and PFET. The gate dielectric layer 102 may be formed on the substrate 100 and STI regions 104 using a conventional deposition method, e.g., a chemical vapor deposition (CVD), low pressure CVD, plasma enhanced CVD (PECVD), atomic layer CVD or physical vapor deposition (PVD) process. Following the formation of the gate dielectric layer 102 (and any optional additional high-k dielectric layers), a relatively thin metal layer 106 is then formed over the gate dielectric layer 102. The metal layer 106 may be a material such as a titanium nitride (TiN) film, for example. Then, a thicker layer of polysilicon 108 is formed over the metal layer 108, followed by an optional hardmask layer 110 (e.g., and oxide of silicon) and a photoresist layer 112 that, in FIG. 1(a), is shown patterned according to the desired layout of the gate stack structures. In lieu of hardmask layer 110, the resist layer 112 may be formed and patterned directly upon the polysilicon layer 108. However, where the hardmask layer 110 is used, the pattern of the patterned resist layer 112 is transferred into the hardmask layer 110 (i.e., the hardmask 110 is opened), as shown in FIG. 1(b), followed by the removal of the resist layer in FIG. 1(c).

Figure 1D:
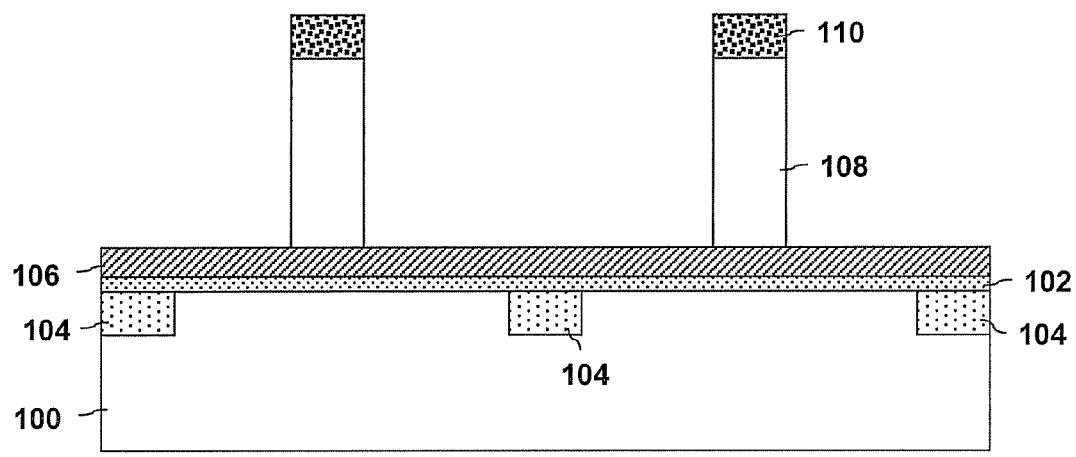
Figure 1E:
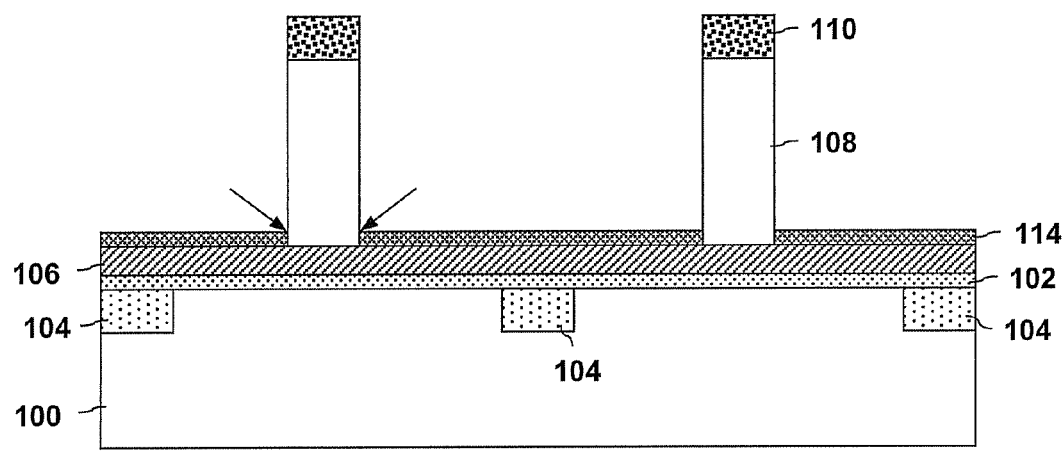

Referring next to FIG. 1(d), a first etch process is used to transfer the hardmask pattern to the polysilicon layer 108 in the gate stack structure. The etch process may include, for example, an HBr/$O_2$ based polysilicon etch. Upon the initial completion of etching the polysilicon layer 108, a top layer 114 of the exposed portions of metal TiN layer 106 is then oxidized in situ as shown in FIG. 1(e), thereby providing a high etch selectivity with respect to the polysilicon material. Thus, where additional etching is used to optimize the sidewall profile of the polysilicon portion of the gate stack structure, the TiO$_x$ layer 114 prevents further etching into the TiN layer 106.

In an exemplary embodiment, the oxidation of the TiN layer 106 may be accomplished through a discrete oxidation step (e.g., oxygen based plasma or annealing). Alternatively, the polysilicon etch process itself (e.g., through an HBr/$O_2$ based polysilicon etch) could also be used to implement the oxidation. As then shown in FIG. 1(f), the oxidized layer 114 is removed prior to etching the metal TiN layer 106. Were the TiO$_x$ layer 114 to be removed by simple sputtering (i.e., a purely physical ion bombardment process), subsequent tapering of the TiN profile can result, as shown by the arrows in FIG. 1(e). This is due to the physical nature of ion bombardment, wherein ion shading reduces the incident ion flux at the inside corners of the polysilicon structure. Accordingly, a simple ion bombardment process is thus supplemented by introducing an electronegative isotropic chemical component to the TiO$_x$ breakthrough process, thereby changing the etch front for a subsequent TiN etch.

In one embodiment, the TiO$_x$ breakthrough is implemented using an ion sputter combined with the introduction of an electronegative halogen, such as a fluorine or fluorine-containing compound. This allows a less damaging level of ion bombardment to be utilized in order to achieve the same breakthrough process result. By way of example, the breakthrough may be implemented at a bias power ranges of about 20 Watts to about 200 Watts, which can introduce a bias voltage of about 40 V to about 250 V. An exemplary intensity of the bias power incident on the wafer surface may range from about 10 to about 1000 mW/cm$^2$ and more particularly, from about 50 to about 300 mW/cm$^2$. Furthermore, the electronegative halogen may comprise a mixture of about 0.01%-8% sulfur hexafluoride (SF$_6$) with a non-reactive gas, and more particularly a mixture of about 4-7% SF$_6$ with argon (Ar).

Figure 1F:
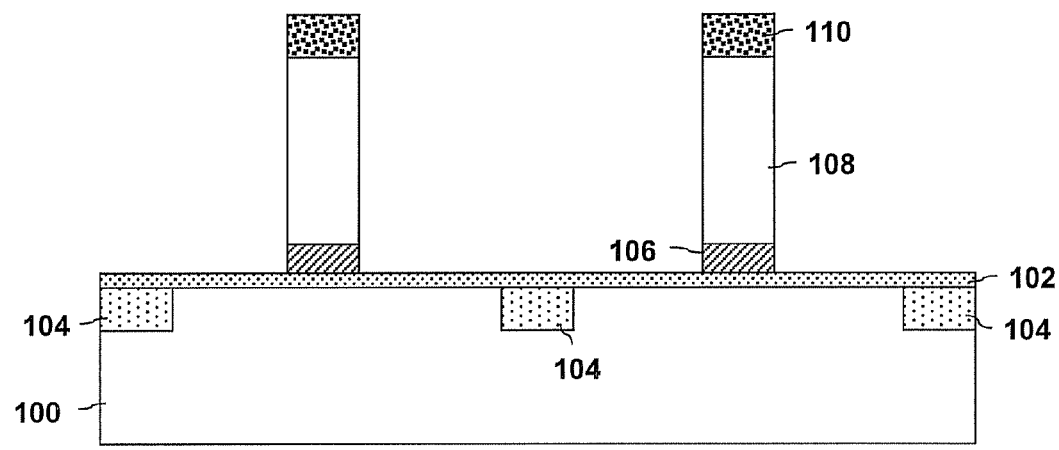
Figure 1G:
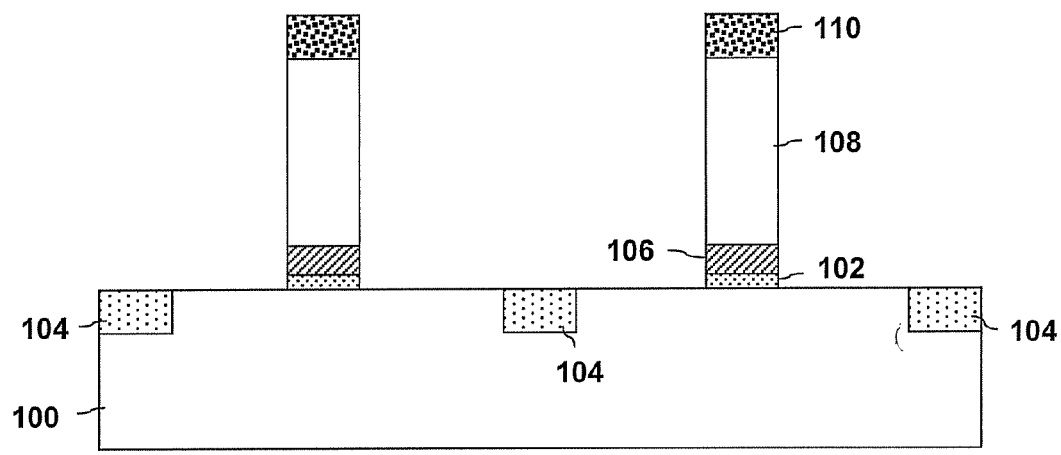
Figure 1H:
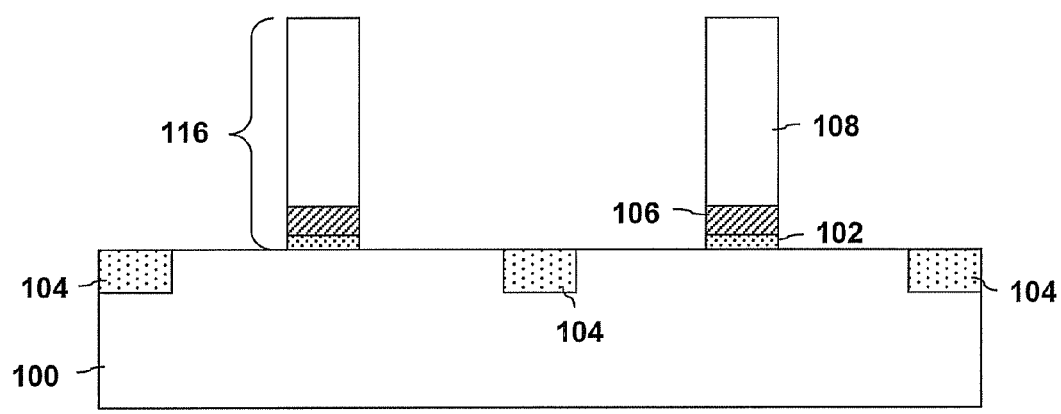

Once the TiO$_x$ layer is removed to expose the TiN layer 106, and without leaving oxide residue on the corner of the polysilicon gate structure 108, the TiN layer 106 is etched using a second etch process as further shown in FIG. 1(f). Where used, still another etch process can then be used to remove a high-k layer included in the gate stack structure, prior to etching the gate stack pattern into the gate dielectric layer as shown in FIG. 1(g). Finally, the patterned hardmask layer 110 of FIG. 1(g) is removed as shown in FIG. 1(h) to define the gate stack structure 116, after which conventional CMOS device processing may resume.

Figure 2:
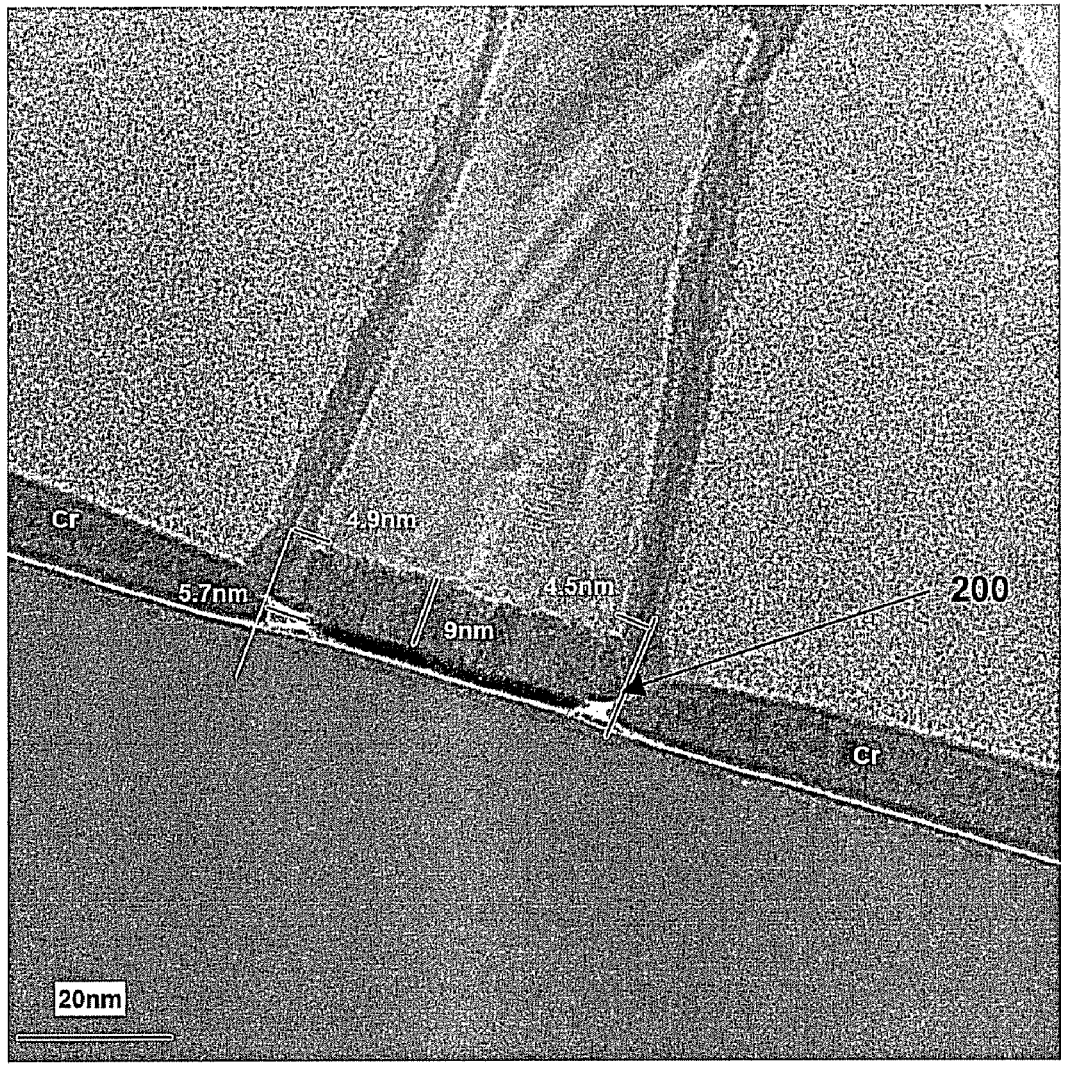
FIG. 2 is a transmission electron micrograph (TEM) image of a conventional metal gate formation process in which footing is present in the metal portion of the gate stack.
Figure 3:
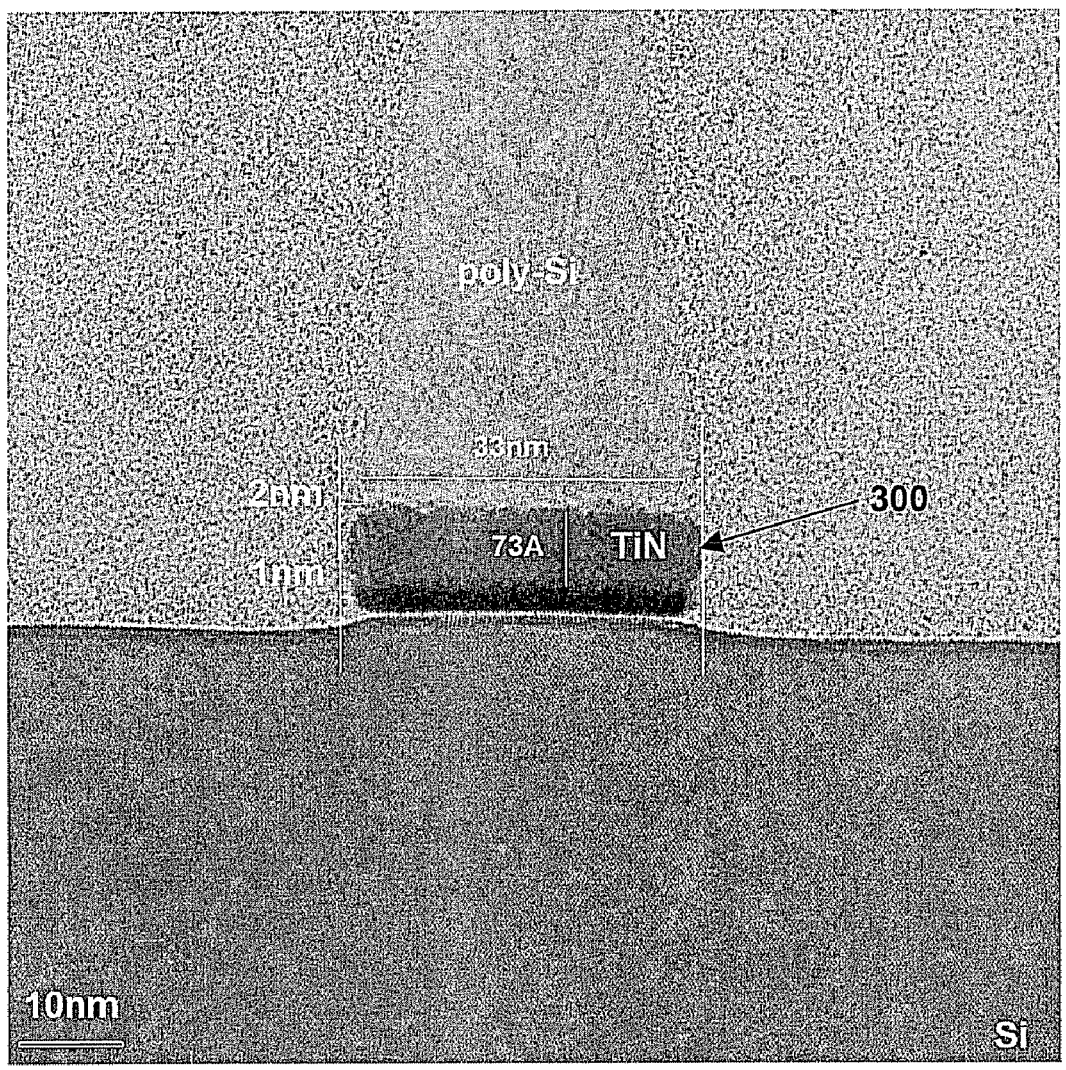
FIG. 3 is a transmission electron micrograph (TEM) image of a metal gate formation process in accordance with an exemplary embodiment of the invention, in which footing in the metal portion of the gate stack has been avoided.

Finally, FIGS. 2 and 3 illustrate a comparison between an exemplary patterning process for multilayer metal gate structures as described herein, versus a conventional process. In particular, FIG. 2 is a TEM image of a conventional metal gate formation process in which a footing 200 is present in the metal portion of the gate stack. In contrast, FIG. 3 is a TEM image of a metal gate formation process in accordance with an exemplary embodiment of the invention, in which footing in the metal portion of the gate stack has been avoided, as depicted by the substantially profile of the metal layer 300.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of patterning multilayer metal gate structures for complementary metal oxide semiconductor (CMOS) devices, the method comprising:
   performing a first etch process to remove exposed portions of a polysilicon layer included within a gate stack, the polysilicon layer formed on a metal layer also included within the gate stack;
   oxidizing an exposed top portion of the metal layer following the first etch process so as to create an metal oxide layer having an etch selectivity with respect to the polysilicon layer;
   removing the metal oxide layer through a combination of a physical ion bombardment thereof, and the introduction of an isotropic chemical component thereto so as to prevent residual oxide material at bottom corners of the polysilicon layer; and
   performing a second etch process to remove exposed portions of the metal layer.

2. The method of claim 1, wherein the metal layer comprises titanium nitride (TiN).

3. The method of claim 1, wherein the isotropic chemical component comprises an electronegative species.

4. The method of claim 3, wherein the electronegative species comprises a halogen material.

5. The method of claim 4, wherein the halogen material comprises a mixture of about 0.01%-8% sulfur hexafluoride ($SF_6$) with a non-reactive gas.

6. The method of claim 4, wherein the halogen material comprises a mixture of about 4-7% $SF_6$ with argon (Ar).

7. The method of claim 1, wherein the physical ion bombardment is implemented at a bias power of about 10 to about 1000 mW/cm$^2$.

8. The method of claim 1, wherein the physical ion bombardment is implemented at a bias power of about 50 to about 300 mW/cm$^2$.

9. The method of claim 1, wherein the oxidizing the top portion of the metal layer is implemented as a result of the first etch process.

10. The method of claim 1, wherein the first etch process comprises an HBr/$O_2$ etch chemistry.

11. A method of patterning multilayer metal gate structures for complementary metal oxide semiconductor (CMOS) devices, the method comprising:
    forming a gate dielectric layer over a substrate;
    forming a metal layer over the gate dielectric layer;
    forming a polysilicon layer over the metal layer so as to define a gate stack;
    defining a gate stack pattern by patterning one or more of a hardmask material and a photoresist material;
    transferring the gate stack pattern into exposed portions the polysilicon layer by performing a first etch process;
    oxidizing an exposed top portion of the metal layer following the first etch process so as to create an metal oxide layer having an etch selectivity with respect to the polysilicon layer;
    removing the metal oxide layer through a combination of a physical ion bombardment thereof, and the introduction of an isotropic chemical component thereto so as to prevent residual oxide material at bottom corners of the polysilicon layer;
    performing a second etch process to remove exposed portions of the metal layer; and
    removing exposed portions of the gate dielectric layer following the second etch process.

12. The method of claim 11, wherein the metal layer comprises titanium nitride (TiN).

13. The method of claim 11, wherein the isotropic chemical component comprises an electronegative species.

14. The method of claim 11, wherein the electronegative species comprises a halogen material.

15. The method of claim 14, wherein the halogen material comprises a mixture of about 0.01%-8% sulfur hexafluoride ($SF_6$) with a non-reactive gas.

16. The method of claim 14, wherein the halogen material comprises a mixture of about 4-7% $SF_6$ with argon (Ar).

17. The method of claim 11, wherein the physical ion bombardment is implemented at a bias power of about 10 to about 1000 mW/cm$^2$.

18. The method of claim 11, wherein the physical ion bombardment is implemented at a bias power of about 50 to about 300 mW/cm$^2$.

19. The method of claim 11, wherein the oxidizing the top portion of the metal layer is implemented as a result of the first etch process.

20. The method of claim 11, wherein the first etch process comprises an HBr/$O_2$ etch chemistry.

* * * * *